United States Patent
Park et al.

(10) Patent No.: US 12,402,310 B2
(45) Date of Patent: Aug. 26, 2025

(54) SEMICONDUCTOR DEVICE WITH IMPROVED CELL DENSITY AND MANUFACTURING METHOD OF THE SEMICONDUCTOR DEVICE

(71) Applicant: SK hynix Inc., Icheon-si (KR)

(72) Inventors: Mi Seong Park, Icheon-si (KR); Jang Won Kim, Icheon-si (KR); In Su Park, Icheon-si (KR); Jung Shik Jang, Icheon-si (KR); Won Geun Choi, Icheon-si (KR); Jung Dal Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 683 days.

(21) Appl. No.: 17/482,797

(22) Filed: Sep. 23, 2021

(65) Prior Publication Data

US 2022/0344366 A1 Oct. 27, 2022

(30) Foreign Application Priority Data

Apr. 23, 2021 (KR) .................. 10-2021-0053233

(51) Int. Cl.
*H10B 43/27* (2023.01)
*H01L 23/48* (2006.01)
*H10B 41/10* (2023.01)
*H10B 41/27* (2023.01)
*H10B 43/10* (2023.01)

(52) U.S. Cl.
CPC .......... *H10B 43/27* (2023.02); *H01L 23/481* (2013.01); *H10B 41/10* (2023.02); *H10B 41/27* (2023.02); *H10B 43/10* (2023.02)

(58) Field of Classification Search
CPC ........ H10B 43/27; H10B 43/10; H10B 41/10; H10B 41/27; H01L 23/481
USPC .......................................................... 257/314
See application file for complete search history.

(56) References Cited

U.S. PATENT DOCUMENTS

| | | | |
|---|---|---|---|
| 8,748,971 B2 | 6/2014 | Tanaka et al. | |
| 2017/0077108 A1* | 3/2017 | Kawaguchi | H10B 43/27 |
| 2018/0277554 A1* | 9/2018 | Kaneko | H01L 21/7682 |
| 2020/0343307 A1* | 10/2020 | Lee | H10B 63/34 |

FOREIGN PATENT DOCUMENTS

| | | |
|---|---|---|
| CN | 107293549 A | 10/2017 |
| CN | 108231781 A | 6/2018 |
| CN | 109801922 A | 5/2019 |
| CN | 112242402 A | 1/2021 |
| KR | 1020160008404 A | 1/2016 |
| KR | 1020160016430 A | 2/2016 |
| KR | 1020180073161 A | 7/2018 |
| KR | 1020200125148 A | 11/2020 |

* cited by examiner

*Primary Examiner* — Eric W Jones
(74) *Attorney, Agent, or Firm* — WILLIAM PARK & ASSOCIATES LTD.

(57) ABSTRACT

A semiconductor device includes a gate structure including conductive layers and insulating layers alternately stacked with each other, channel structures passing through the gate structure and arranged in a first direction, a cutting structure extending in the first direction and passing through the channel structures, and a first slit structure passing through the gate structure and extending in a second direction crossing the first direction.

15 Claims, 26 Drawing Sheets

SEMICONDUCTOR DEVICE WITH IMPROVED CELL DENSITY AND MANUFACTURING METHOD OF THE SEMICONDUCTOR DEVICE

CROSS-REFERENCE TO RELATED APPLICATION

The present application claims priority under 35 U.S.C. § 119(a) to Korean patent application number 10-2021-0053233, filed on Apr. 23, 2021, which is incorporated herein by reference in its entirety.

BACKGROUND

1. Technical Field

The disclosed technology generally relates to an electronic device, and more particularly, to a semiconductor device and a method of manufacturing the semiconductor device.

2. RELATED ART

The integration density of a semiconductor device may be determined mainly by an area of a unit memory cell. The increase in integration density of a semiconductor device in which memory cells are formed in a single layer over a substrate has recently been limited. Thus, a three-dimensional semiconductor device has been proposed in which memory cells are stacked over a substrate. In addition, to improve the operational reliability of semiconductor devices, various structures and manufacturing methods have been developed.

SUMMARY

Various embodiments are directed to a semiconductor device having a stable structure and improved characteristics, and a method of manufacturing the semiconductor device.

According to an embodiment, a semiconductor device may include a gate structure including conductive layers and insulating layers alternately stacked with each other, channel structures passing through the gate structure and arranged in a first direction, a cutting structure extending in the first direction and passing through the channel structures, and a first slit structure passing through the gate structure and extending in a second direction crossing the first direction.

According to an embodiment, a semiconductor device may include a gate structure including conductive layers and insulating layers alternately stacked with each other, pillar structures passing through the gate structure, a cutting structure passing through the pillar structures and separating each of the pillar structures into a first pillar structure and a second pillar structure, a first slit structure passing through the gate structure and extending in a direction crossing the cutting structure, a first interconnection line extending in a direction crossing the first slit structure and coupled to the first pillar structures, and a second interconnection line extending in a direction crossing the first slit structure and coupled to the second pillar structures.

According to an embodiment, a method of manufacturing a semiconductor device may include forming a stacked structure, forming channel structures passing through the stacked structure and arranged in a first direction, forming a cutting structure passing through the channel structures and extending in the first direction, and forming a first slit structure passing through the stacked structure and extending in a second direction crossing the first direction.

BRIEF DESCRIPTION OF THE DRAWINGS

FIGS. 5A and 53, FIGS. 6A and 63, FIGS. 7A to 7C, and FIGS. 8A to 8C are diagrams illustrating a method of manufacturing a semiconductor device according to an embodiment of the present disclosure;

FIGS. 9A and 93 are diagrams illustrating a method of manufacturing a semiconductor device according to an embodiment of the present disclosure;

DETAILED DESCRIPTION

Specific structural or functional descriptions of examples of embodiments in accordance with concepts which are disclosed in this specification are illustrated only to describe the examples of embodiments in accordance with the concepts and the examples of embodiments in accordance with the concepts may be carried out by various forms but the descriptions are not limited to the examples of embodiments described in this specification.

FIGS. 1A to 1D are diagrams illustrating the structure of a semiconductor device according to an embodiment of the present disclosure.

Figure 1A:
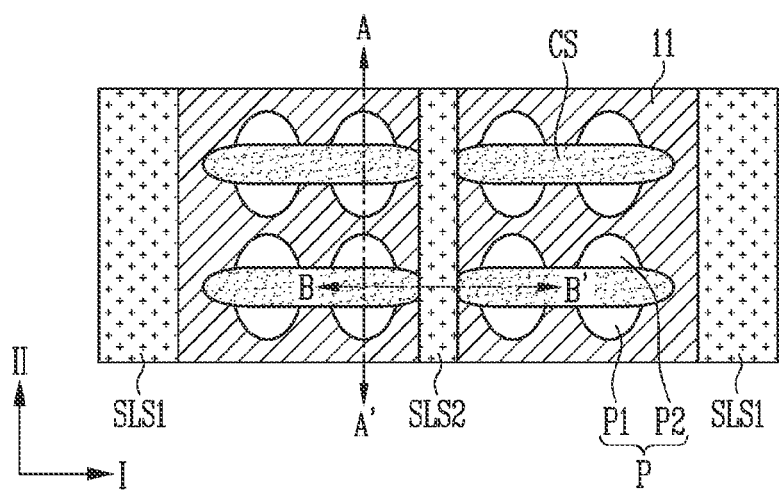
FIGS. 1A to 1D are diagrams illustrating the structure of a semiconductor device according to an embodiment of the present disclosure.
Figure 1B:
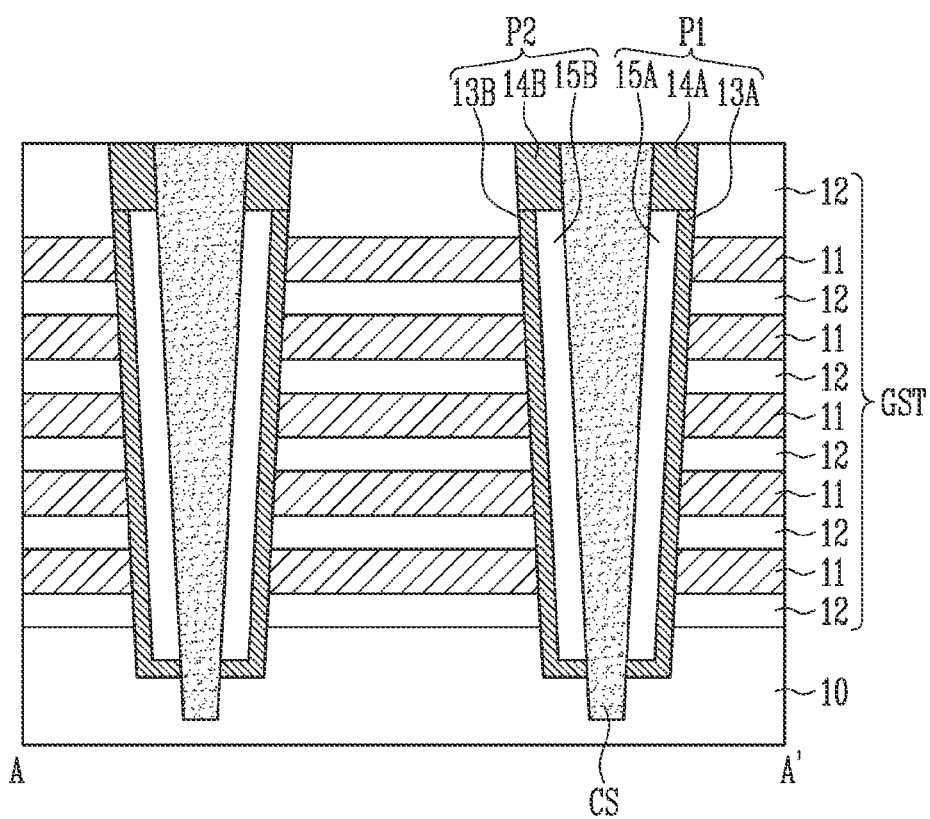
Figure 1C:
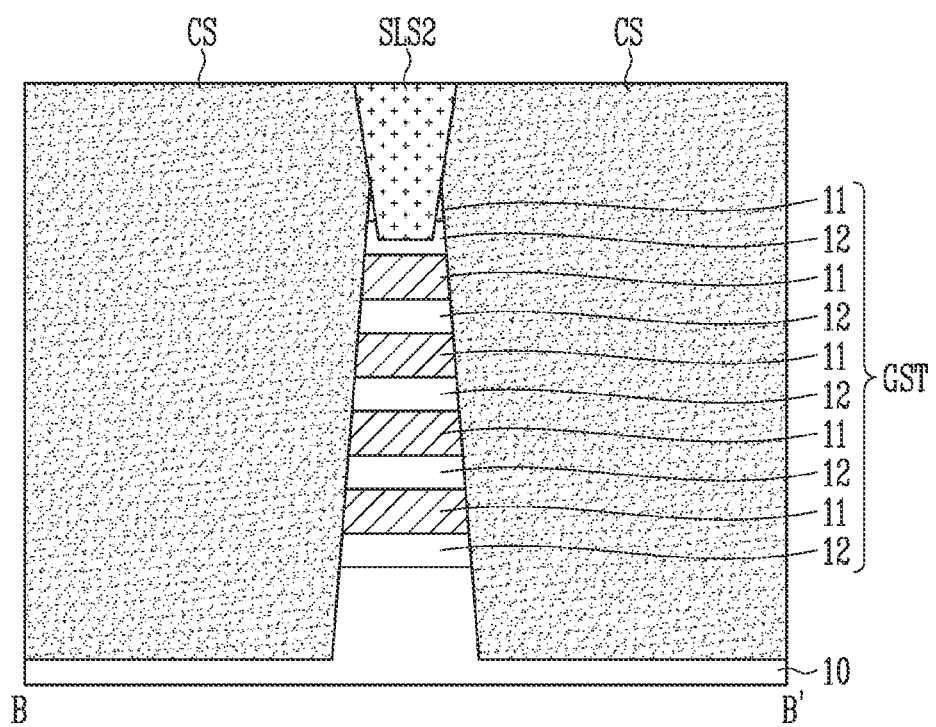

Referring to FIGS. 1A to 1C, a semiconductor device may include a gate structure GST, pillar structures P, a cutting structure CS, and a first slit structure SLS1, The semiconductor device may include a base 10, a second slit structure SLS2, a first contact plug CT1, a second contact plug CT2, or a combination thereof.

The gate structure GST may include conductive layers 11 and insulating layers 12 that are stacked alternately with each other. Each of the conductive layers 11 may be a gate electrode of a memory cell or a select transistor. The conductive layers 11 may include a conductive material such as polysilicon or metal (e.g., tungsten, molybdenum). The insulating layers 12 may insulate the stacked conductive layers 11 from each other. The insulating layers 12 may include an insulating material such as oxides, nitrides, or air gaps.

The gate structure GST may be located on the base 10. The base 10 may be a semiconductor substrate or a source layer. The semiconductor substrate may include a source region which is doped with impurities. The source layer may include a conductive material such as polysilicon, tungsten, molybdenum, or metal.

The pillar structures P may pass through the gate structure GST. The pillar structures P may be arranged in a first direction I and a second direction II crossing the first direction I, Crossing directions means the directions are not parallel. For example, the directions may be substantially perpendicular to one another. According to an embodiment, the pillar structures P may be arranged in a matrix format.

Each of the pillar structures P may include a pair of a first pillar structure P1 and a second pillar structure P2. Each of the pillar structures P may be split into one pair of the first pillar structure P1 and the second pillar structure P2 by the cutting structure CS. The one pair of the first pillar structure P1 and the second pillar structure P2 may neighbor each other in the second direction II with the cutting structure CS interposed therebetween, or may have a symmetrical structure with respect to the cutting structure CS.

According to an embodiment, each of the pillar structures P may be a channel structure which includes channel layers 13A and 13B. The first pillar structure P1 may be a first channel structure and the second pillar structure P2 may be a second channel structure. First memory cells or select transistors may be arranged at intersections of the first pillar structure P1 and the conductive layers 11, Second memory cells or select transistors may be arranged at intersections of the second pillar structure P2 and the conductive layers 11. The first memory cell and the second memory cell that neighbor each other in the second direction II with the cutting structure CS interposed therebetween may be driven independently of each other.

The first pillar structure P1 may include a first channel layer 13A. The first channel layer 13A may refer to a region where a channel of a memory cell, a select transistor, and the like is formed. The first channel layer 13A may include a semiconductor material such as silicon or germanium. The first pillar structure P1 may further include a first conductive pad 14A. The first conductive pad 14A may be coupled to the first channel layer 13A and include a conductive material. The first pillar structure P1 may include a first insulating core 15A. The first insulating core 15A may include an insulating material such as oxides, nitrides, and air gaps. The first pillar structure P1 may further include a memory layer (not illustrated) which is located between the first channel layer 13A and the conductive layers 11. The memory layer may include at least one of a tunneling layer, a data storage layer, and a blocking layer. The data storage layer may include a floating gate, a charge trapping material, polysilicon, a nitride, a variable resistance material, a nanostructure, or a combination thereof.

The second pillar structure P2 may have a similar structure to the first pillar structure P1. The second pillar structure P2 may include the second channel layer 13B, The second pillar structure P2 may further include a second conductive pad 14B, a second insulating core 15B, or a combination thereof.

According to an embodiment, each of the pillar structures P may be an electrode structure that includes an electrode layer. The first pillar structure P1 may be a first electrode structure and the second pillar structure P2 may be a second electrode structure. The first electrode structure may include a first electrode layer instead of the first channel layer 13A. The first electrode structure may further include a first conductive pad 14A, a first insulating core 15A, or a combination thereof. The first pillar structure P1 may further include a memory layer (not illustrated) which is located between the first electrode layer and the conductive layers 11. The second electrode structure may include a second electrode layer instead of the second channel layer 13B. The second electrode structure may further include the second conductive pad 14B, the second insulating core 15B, or a combination thereof. The second pillar structure P2 may further include a memory layer (not illustrated) which is located between the second electrode layer and the conductive layers 11.

The cutting structure CS may pass through the pillar structures P and extend to the base 10. The cutting structure CS may pass through the gate structure GST and the pillar structures P1 and extend in the first direction I. The cutting structure CS may successively pass through the pillar structures P. The cutting structure CS may cross at least two of the pillar structures P arranged in the first direction I and may separate each pillar structure P into a pair of the first pillar structure P1 and the second pillar structure P2. The cutting structure CS may include an insulating material such as oxides, nitrides, and air gaps.

A plurality of cutting structures CS may be located between one pair of the first slit structures SLS1. The cutting structures CS may be arranged in the first direction I and the second direction II. According to an embodiment, the cutting structures CS may be arranged in a matrix format.

The first slit structure SLS1 may pass through the gate structure GST. The first slit structure SLS1 may extend in a direction crossing the cutting structure CS. The first slit structure SLS1 may extend in the second direction According to an embodiment, the first slit structure SLS1 may be arranged perpendicular to the cutting structure CS. The first slit structure SLS1 may include an insulating material. According to an embodiment, the first slit structure SLS1 may include a contact structure which is electrically coupled to the base 10 and an insulating spacer which insulates the contact structure and the conductive layers 11 from each other.

The second slit structure SLS2 may pass through the gate structure GST at a shallower depth than the first slit structure SLS1 or the cutting structure CS. The second slit structure SLS2 may have a depth that passes through at least one uppermost conductive layer 11. According to an embodiment, the second slit structure SLS2 may have a depth such that the second slit structure SLS2 passes through at least one conductive layer 11 corresponding to a select line among the conductive layers 11, and does not pass through the conductive layers 11 corresponding to word lines.

At least one second slit structure SLS2 may be located between one pair of the first slit structures SLS1. The second slit structure SLS2 may extend in a direction crossing the cutting structure CS, The second slit structure SLS2 may extend in parallel with the first slit structure SLS1. The second slit structure SLS2 may extend in the second direction II. The cutting structures CS may be arranged symmetrically or asymmetrically at both sides with respect to the second slit structure SLS2. The second slit structure SLS2 may contact at least one cutting structure CS, The pillar structures P may be located between the first slit structure SLS1 and the second slit structure SLS2. Some of the pillar structures P may contact the second slit structure SLS2.

Figure 1D:
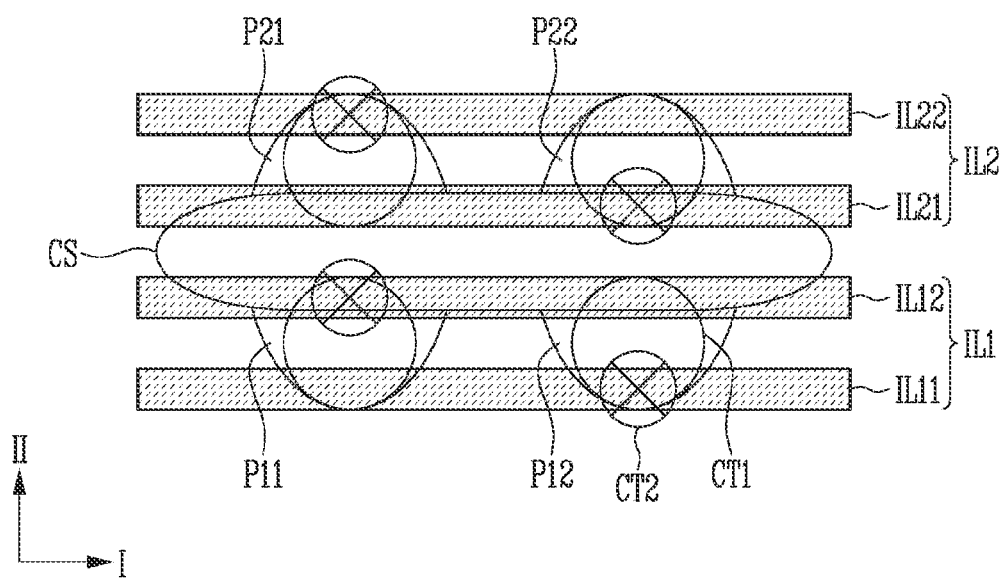

Referring to FIGS. 1A and 1D, the semiconductor device may further include a first interconnection line IL1 and a second interconnection line IL2, The first interconnection line IL1 and the second interconnection line IL2 may extend in a direction crossing the first slit structure SLS1 or the second slit structure SLS2. The first interconnection line IL1 and the second interconnection line IL2 may run parallel with the cutting structure CS and extend in the first direction I.

According to an embodiment, the first contact plug CT1 may be coupled to a first pillar structure P12 and the second contact plug CT2 may be coupled to the first contact plug CT1. According to an embodiment, the first contact plug CT1 and the second contact plug CT2 may be located at different levels, and an upper surface of the first contact plug CT1 and a bottom surface of the second contact plug CT2 may be coupled to each other. A first interconnection line IL11 may be coupled to a first pillar structure P12 through the first contact plug CT1 and the second contact plug CT2. A first interconnection line IL12 may be coupled to a first pillar structure P11 through the first contact plug CT1 and the second contact plug CT2. A second interconnection line IL21 may be coupled to a second pillar structure P22 through the first contact plug CT1 and the second contact plug CT2. A second interconnection line IL22 may be coupled to a second pillar structure P21 through the first contact plug CT1 and the second contact plug CT2.

However, the numbers of the first slit structures SLS1, the second slit structures SLS2, and the pillar structures P as shown in FIGS. 1A and 1D may vary. For example, the number of pillar structures P located between one pair of the first slit structures SLS1, the number of pillar structures P located between the first slit structure SLS1 and the second slit structure SLS2, the number of cutting structures CS located between on pair of the first slit structures SLS1, and the number of cutting structures CS located between the first slit structure SLS1 and the second slit structure SLS2 may vary.

According to the above-described structure, one pillar structure P may be separated into a plurality of pillar structures P1 and P2 using the cutting structure CS. Therefore, the number of memory cells realized with one pillar structure P may be increased. Therefore, the number of memory cells included in the gate structure GST may be increased even when the number of stacked conductive layers 11 included in the gate structure GST is not increased.

Figure 2A:
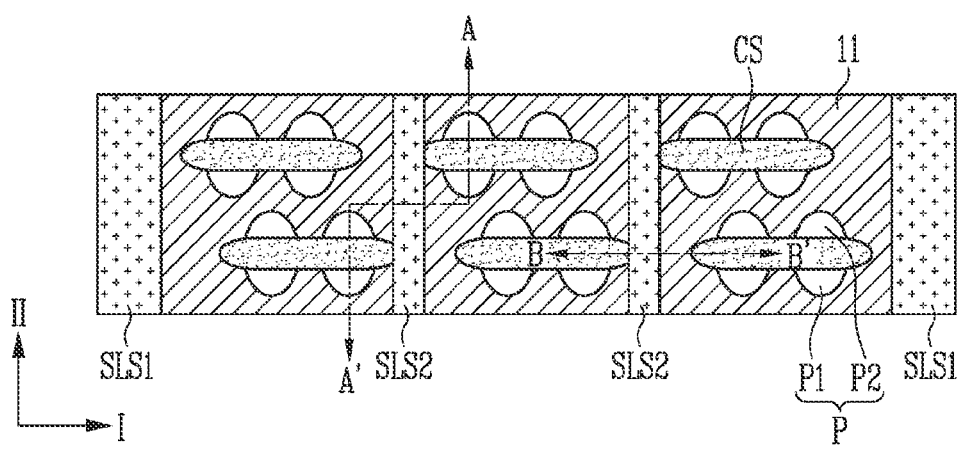
FIGS. 2A to 2C are diagrams illustrating the structure of a semiconductor device according to an embodiment of the present disclosure.
Figure 2B:
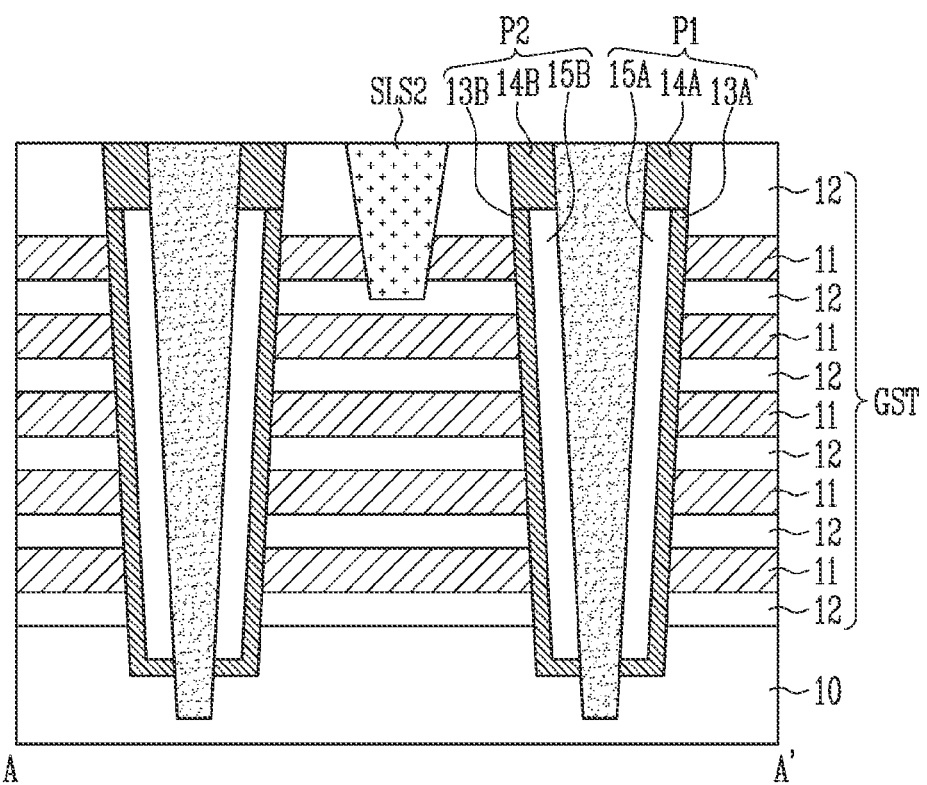
Figure 2C:
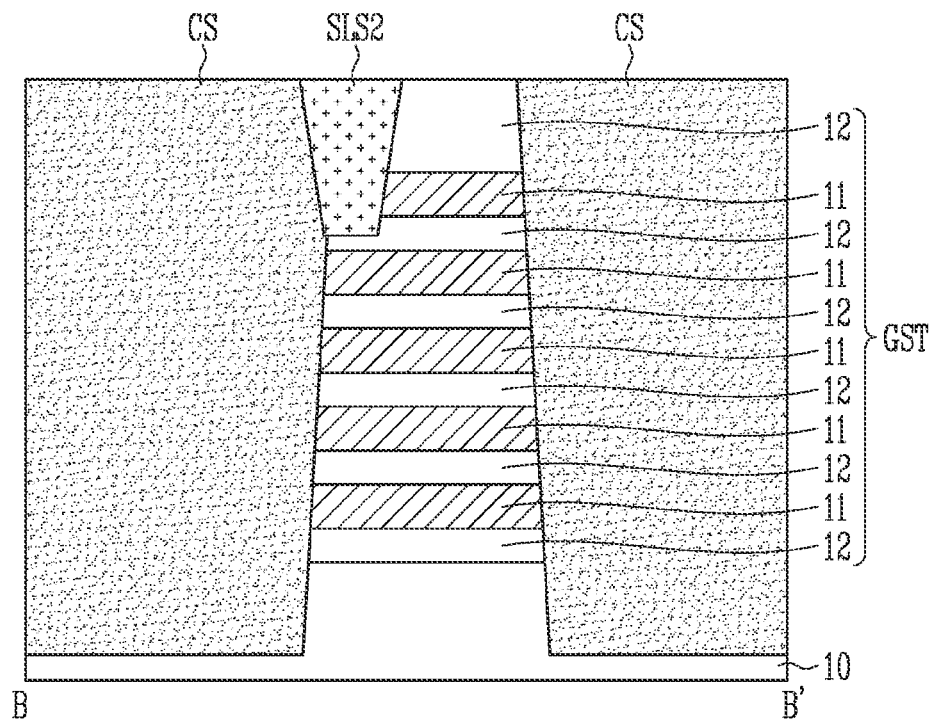

FIGS. 2A to 2C are diagrams illustrating the structure of a semiconductor device according to an embodiment of the present disclosure. Hereinafter, repeated descriptions of certain elements that are described above are omitted for brevity.

Referring to FIGS. 2A to 2C, a semiconductor device may include the gate structure GST, the pillar structures P, the cutting structure CS, and the first slit structure SLS1. The semiconductor device may include the base 10, the second slit structure SLS2, the first contact plug CT1, the second contact plug CT2, or a combination thereof.

The pillar structures P may be staggered with respect to each other. According to an embodiment, centers of the pillar structures P which are adjacent to each other in the first direction I may coincide with each other, while centers of the pillar structures P which are adjacent to each other in the second direction II may be offset from each other.

The cutting structures CS may be staggered with respect to each other. According to an embodiment, centers of the cutting structures CS which are adjacent to each other in the first direction I may coincide with each other, while centers of the cutting structures CS which are adjacent to each other in the second direction II may be offset from each other.

Two or more second slit structures SLS2 may be located between one pair of the first slit structures SLS1. FIG. 2A, for example, shows two second slit structures SLS2 between a pair of first slit structures SLS1. The pillar structures P may be located between the first slit structure SLS1 and the second slit structure SLS2 and between the second slit structures SLS2.

The second slit structure SLS2 may contact some of the cutting structures CS at both sides thereof. The second slit structure SLS2 may contact the cutting structure CS at one side thereof and be separated from the cutting structure CS at the other side thereof.

Figure 3A:
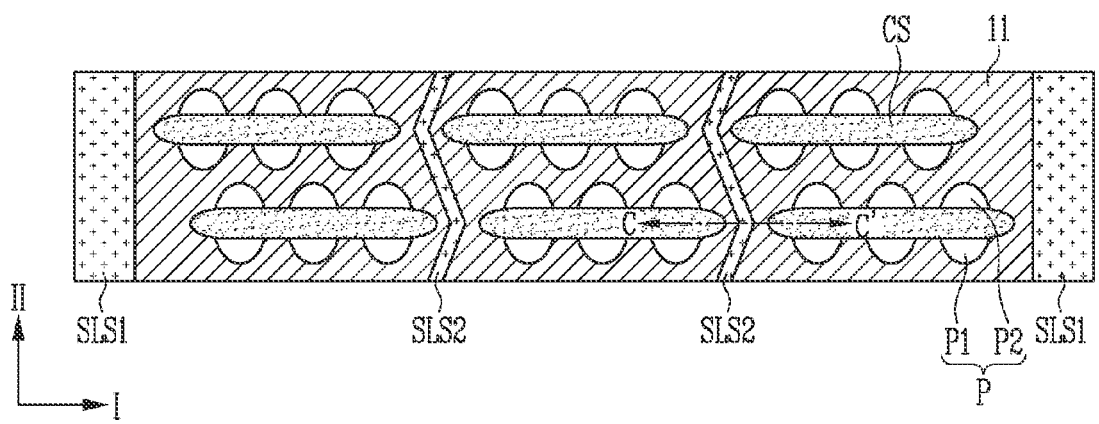
FIGS. 3A to 3C are diagrams illustrating the structure of a semiconductor device according to an embodiment of the present disclosure.
Figure 3B:
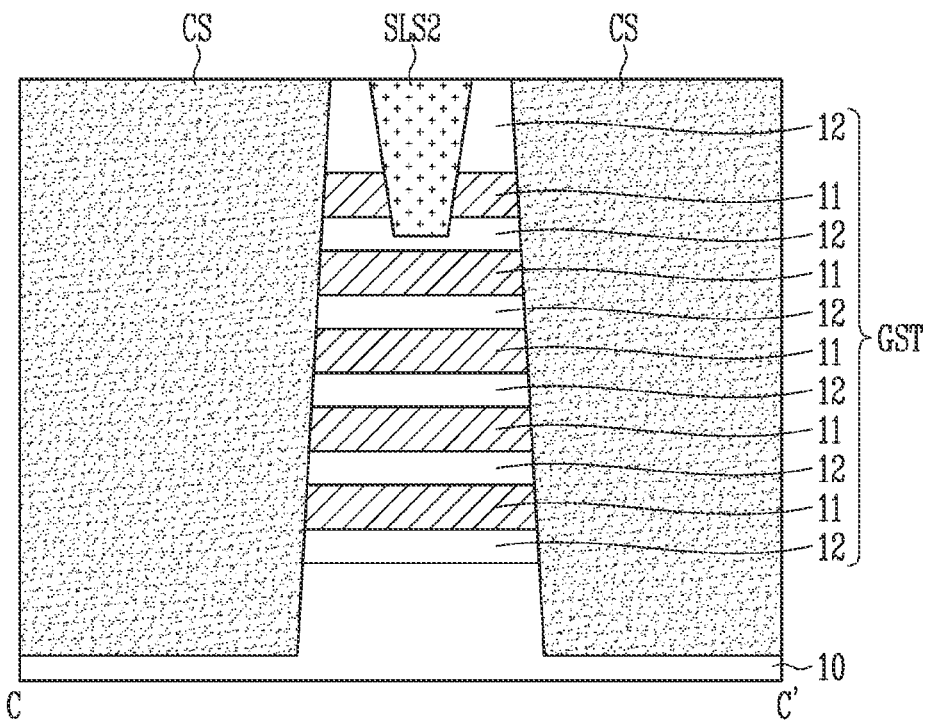
Figure 3C:
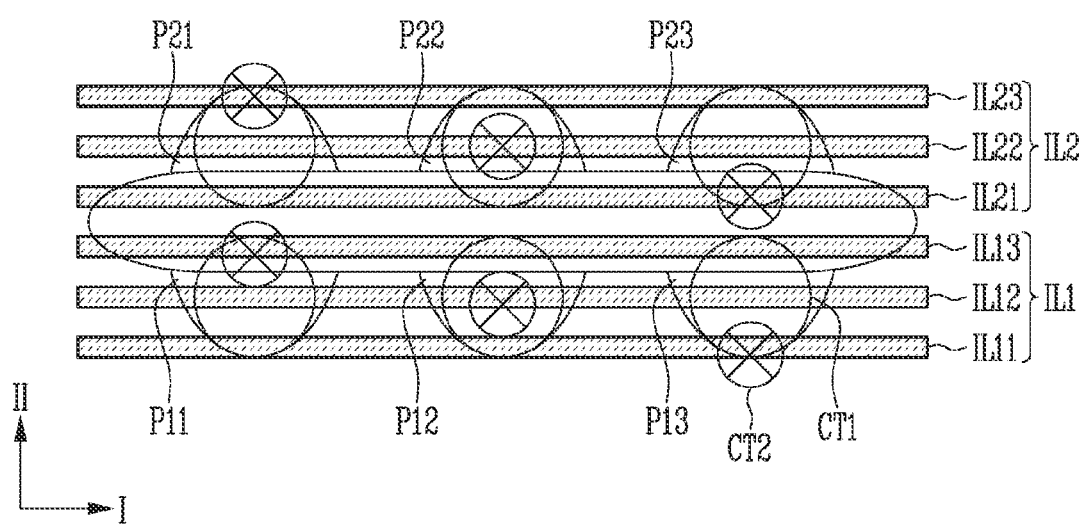

FIGS. 3A to 3C are diagrams illustrating the structure of a semiconductor device according to an embodiment of the present disclosure. Hereinafter, repeated descriptions of certain elements that are described above are omitted for brevity.

Referring to FIGS. 3A and 3B, a semiconductor device may include the gate structure GST, the pillar structures P, the cutting structure CS, and the first slit structure SLS1. The semiconductor device may further include the base 10, the second slit structure SLS2, or a combination thereof.

The cutting structure CS may pass through three or more pillar structures P that are arranged in the first direction I. The second slit structure SLS2 may have a zigzag shape, such as a shape including non-parallel line segments joined end-to-end, or a wave shape, such as a shape including curves joined end-to-end. A zigzag shape, for example, is pictured in FIG. 3A. The second slit structure SLS2 may be separated from the cutting structures CS at both sides thereof.

Referring to FIG. 3C, the semiconductor device may further include the first interconnection line IL1 and the second interconnection line IL2. The first interconnection line IL1 and the second interconnection line IL2 may extend in the first direction I.

According to an embodiment, the first interconnection line IL11 may be coupled to a first pillar structure P13 through the first contact plug CT1 and the second contact plug CT2, The first interconnection line IL12 may be coupled to the first pillar structure P12 through the first contact plug CT1 and the second contact plug CT2. A first interconnection line IL13 may be coupled to the first pillar structure P11 through the first contact plug CT1 and the second contact plug CT2. The second interconnection line IL21 may be coupled to a second pillar structure P23. The second interconnection line IL22 may be coupled to the second pillar structure P22. A second interconnection line IL23 may be coupled to the second pillar structure P21.

FIGS. 4A to 4D are diagrams illustrating the structure of a semiconductor device according to an embodiment of the present disclosure. Hereinafter, repeated descriptions of certain elements that are described above are omitted for brevity.

Figure 4A:
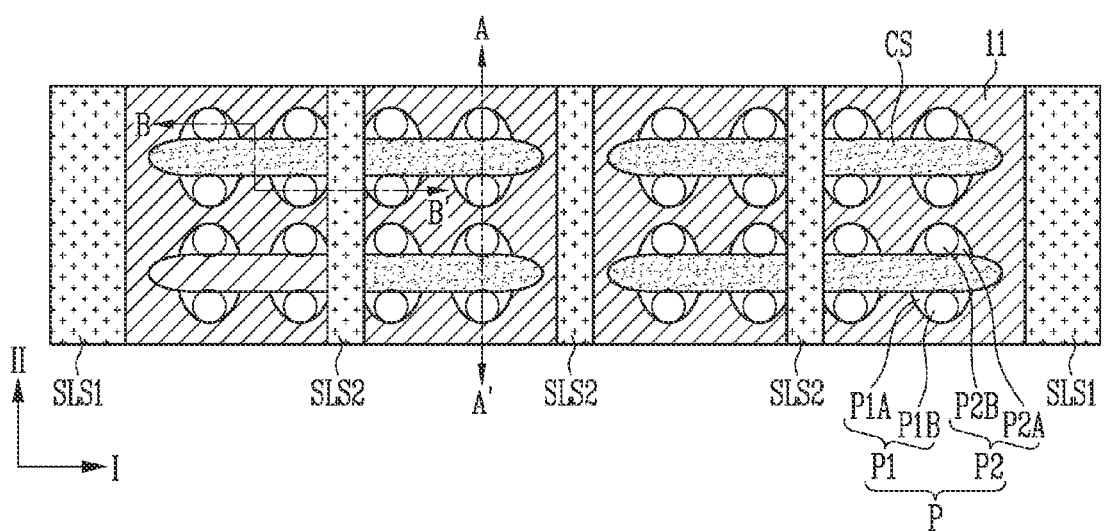
FIGS. 4A to 4D are diagrams illustrating the structure of a semiconductor device according to an embodiment of the present disclosure.
Figure 4B:
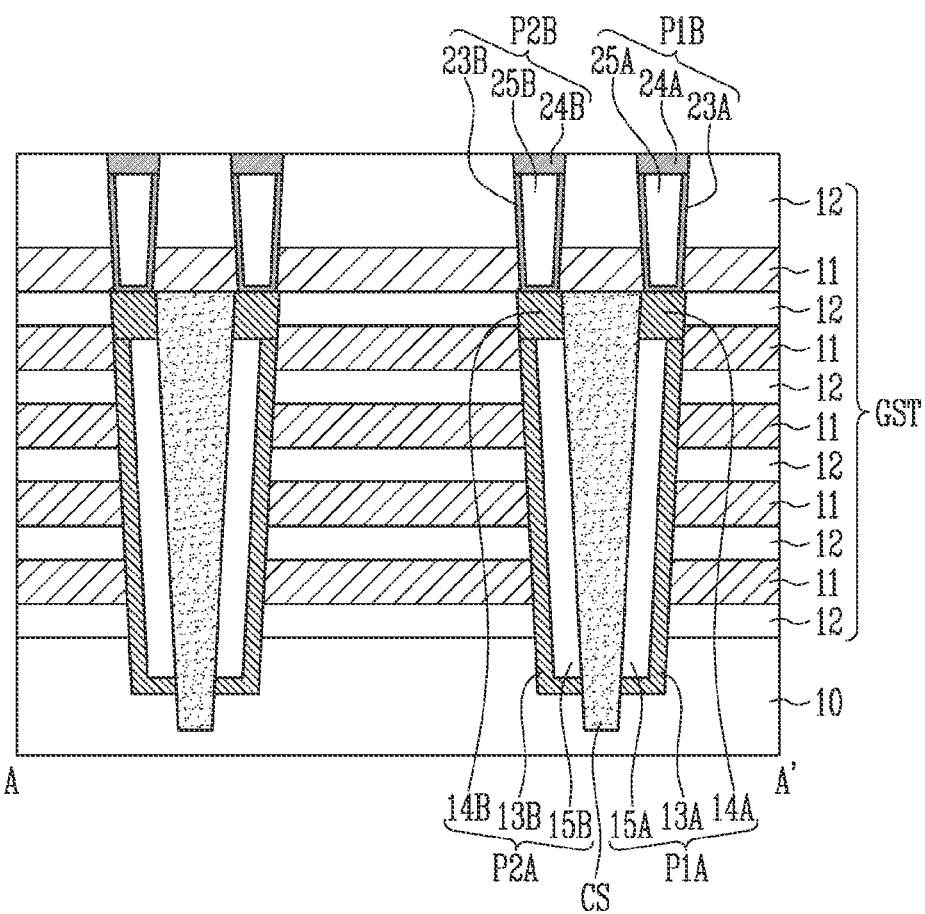
Figure 4C:
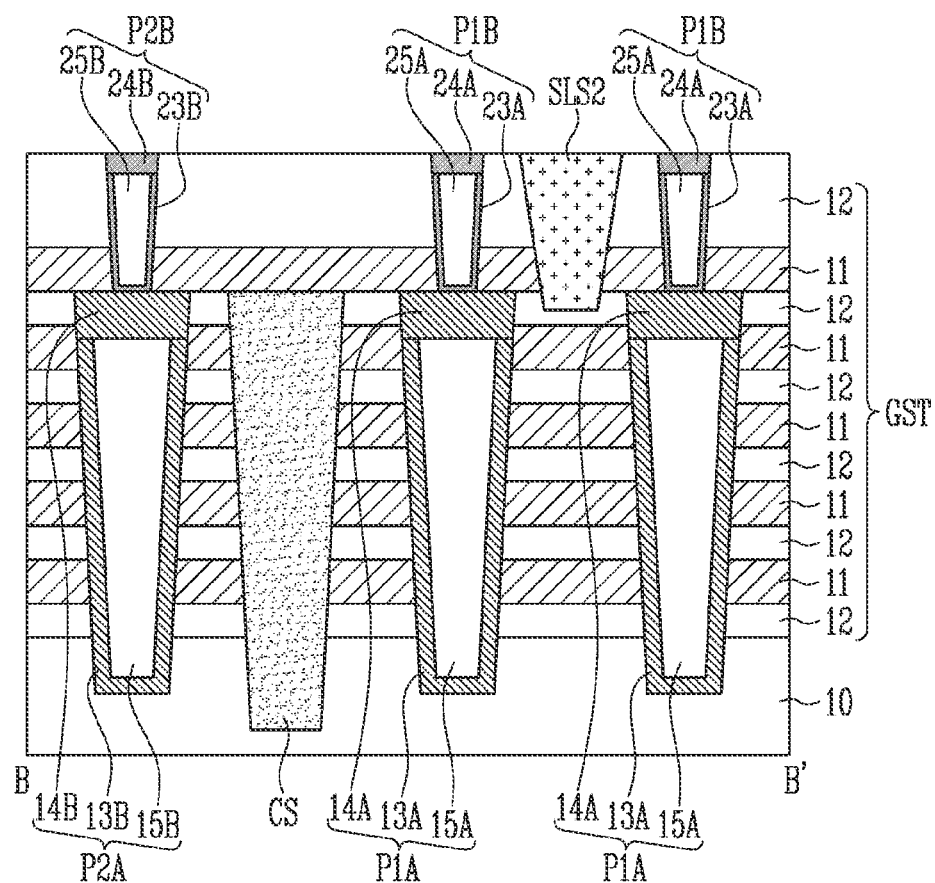

Referring to FIGS. 4A to 4C, a semiconductor device may include the gate structure GST, the pillar structures P, the cutting structure CS, and the first slit structure SLS1. The semiconductor device may include the base 10, the second slit structure SLS2, the first contact plug CT1, the second contact plug CT2, or a combination thereof.

Each of the pillar structures P may include the first pillar structure P1 and the second pillar structure P2. The first pillar structure P1 may include a first sub pillar structure P1A and a second sub pillar structure P1B. The second pillar structure P2 may include a first sub pillar structure P2A and a second sub pillar structure P2B.

The second sub pillar structures P1B and P2B may include at least one uppermost conductive layer among the conductive layers 11. The first sub pillar structures P1A and P2A may pass through the remaining conductive layers 11 among the conductive layers 11, According to an embodiment, the first sub pillar structures P1A and P2A may correspond to a memory cell or a source select transistor, and the second sub pillar structures P1B and P2B may correspond to a drain select transistor.

The first sub pillar structure PIA may include the first channel layer 13A, the first conductive pad 14A, the first insulating core 15A, or a combination thereof. The second sub pillar structure P1B may include a first channel layer 23A, a first conductive pad 24A, a first insulating core 25A, or a combination thereof. The first sub pillar structure P2A may include the second channel layer 13B, the second conductive pad 14B, the second insulating core 15B, or a combination thereof. The second sub pillar structure P2B may include a second channel layer 23B, a second conductive pad 24B, a second insulating core 25B, or a combination thereof. A first electrode layer and a second electrode layer may replace the first channel layer 13A or 23A and the second channel layer 13B or 23B.

Figure 4D:
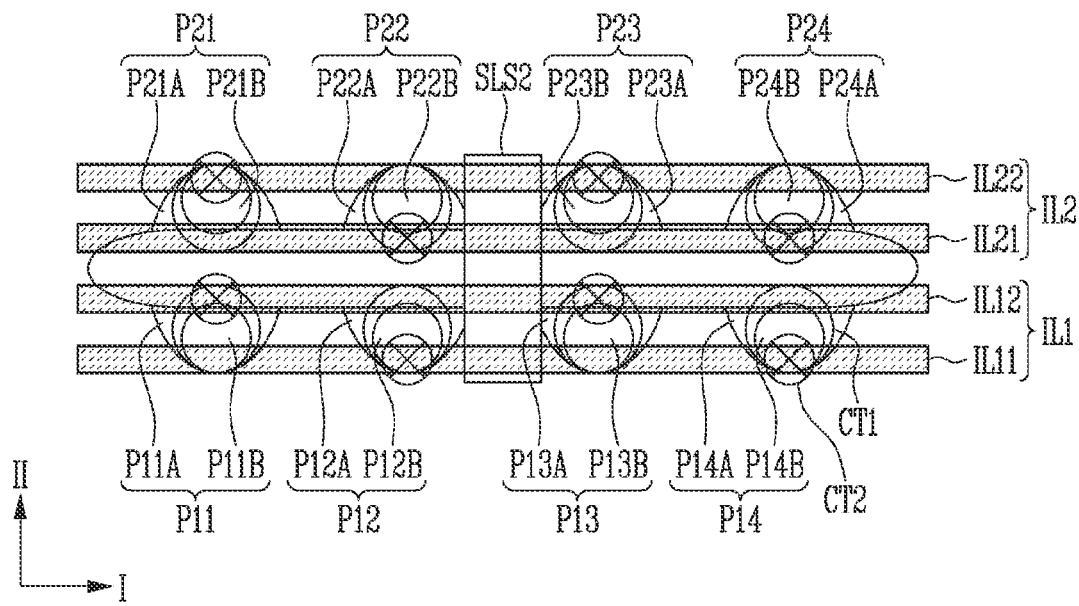

Referring to FIG. 4D, the semiconductor device may further include the first interconnection line IL1 and the second interconnection line IL2. The first interconnection line IL1 and the second interconnection line IL2 may extend in the first direction I.

According to an embodiment, the first pillar structure P11 may include a first sub pillar structure P11A and a second sub pillar structure PUB, The first pillar structure P12 may include a first sub pillar structure P12A and a second sub pillar structure P12B. The first pillar structure P13 may include a first sub pillar structure P13A and a second sub pillar structure P13B. A first pillar structure P14 may include a first sub pillar structure P14A and a second sub pillar structure P14B. The first contact plug CT1 may be coupled to the second sub pillar structures PUB to P14B of the first pillar structures P11 to P14. The second contact plug CT2 may be coupled to the first contact plug CT1.

The second pillar structure P21 may include a first sub pillar structure P21A and a second sub pillar structure P21B. The second pillar structure P22 may include a first sub pillar structure P22A and a second sub pillar structure P22B. The second pillar structure P23 may include a first sub pillar structure P23A and a second sub pillar structure P23B, A second pillar structure P24 may include a first sub pillar structure P24A and a second sub pillar structure P24B. The first contact plug CT1 may be coupled to the second sub pillar structures P21B to P24B of the second pillar structures P21 to P24. The second contact plug CT2 may be coupled to the first contact plug CT1. The first interconnection line IL11 may be coupled to the first pillar structure P12 and the first pillar structure P14 through the first contact plugs CT1 and the second contact plugs CT2, The first interconnection line IL12 may be coupled to the first pillar structure P11 and the first pillar structure P13 through the first contact plugs CT1 and the second contact plugs CT2. The second interconnection line IL21 may be coupled to the second pillar structure P22 and the second pillar structure P24 through the first contact plugs CT1 and the second contact plugs CT2. The second interconnection line IL22 may be coupled to the second pillar structure P21 and the second pillar structure P23 through the first contact plugs CT1 and the second contact plugs CT2.

FIGS. 5A and 5B, FIGS. 6A and 6B, FIGS. 7A to 7C, and FIGS. 8A to 8C are diagrams illustrating a method of manufacturing a semiconductor device according to an embodiment of the present disclosure.

Figure 5A:
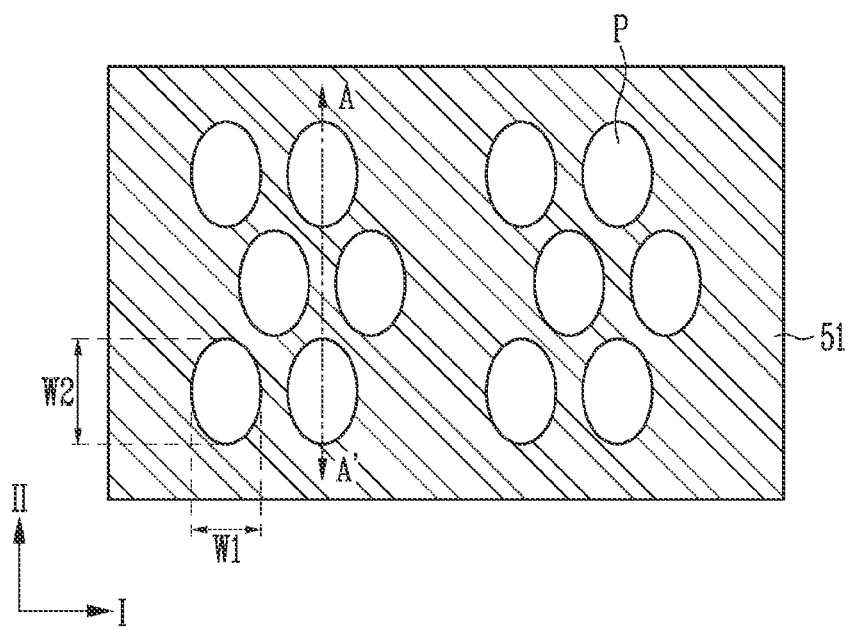
Figure 5B:
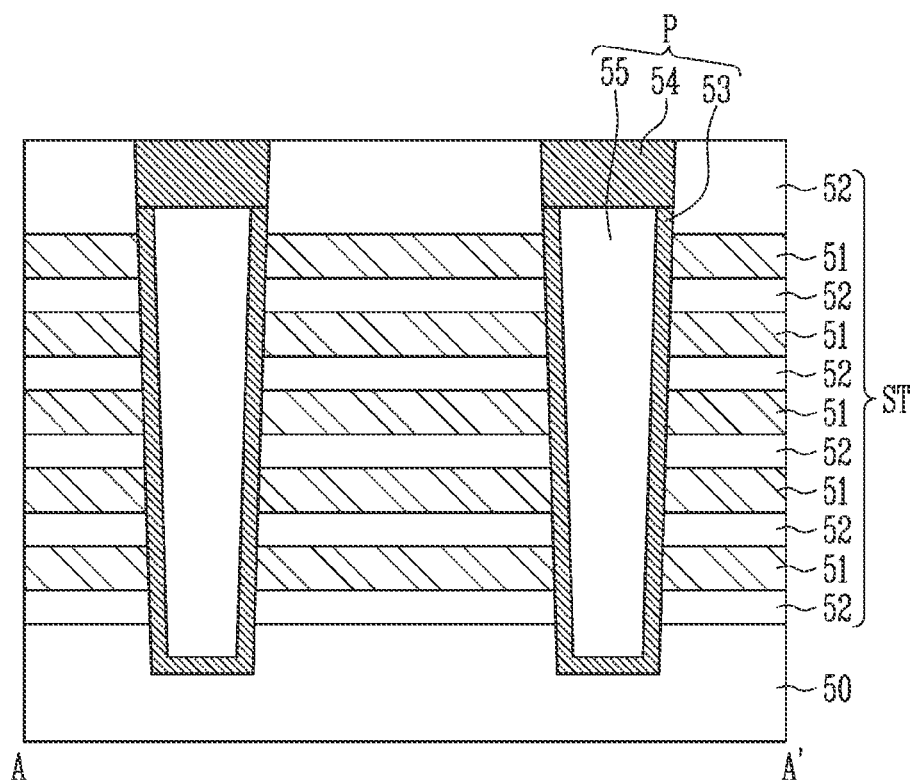

Referring to FIGS. 5A and 5B, a stacked structure ST may be formed on a base 50. The base 50 may be a semiconductor substrate, a source structure, or the like. The semiconductor substrate may include a source region doped with impurities. The source structure may include a source layer including a conductive material such as polysilicon, tungsten, molybdenum, or metal. Alternatively, however, the source region may include a sacrificial layer to be replaced with a source layer during subsequent processes.

The stacked structure ST may be formed by alternately forming first material layers 51 and second material layers 52. The first material layers 51 may include a material having a high etch selectivity with respect to the second material layers 52. For example, the first material layers 51 may include a sacrificial material, such as a nitride, and the second material layers 52 may include an insulating material, such as an oxide. In another example, the first material layers may include a conductive material, such as polysilicon, tungsten, or molybdenum, and the second material layers 52 may include an insulating material, such as an oxide.

Subsequently, the pillar structures P may be formed through the stacked structure ST. The pillar structures P may be arranged in the first direction I and the second direction II crossing the first direction I, The pillar structures P neighboring each other in the first direction I may be arranged so that centers thereof may coincide with each other. On the other hand, the pillar structures P neighboring each other in the second direction II may be arranged so that centers thereof may be offset from each other.

In the plane defined by the first direction I and the second direction II, the pillar structure P may have various shapes such as a circle, an ellipse, and a polygon. A planar cross section of the pillar structure P may have a first width W1 in the first direction I and a second width W2 in the second direction II. The first width W1 and the second width W2 may be the same as or different from each other. In consideration of the width of a cutting structure to be formed during subsequent processes, the second width W2 may be greater than the first width W1.

Each of the pillar structures P may include a channel layer 53. According to an embodiment, after an opening is formed through the stacked structure ST, the channel layer 53 may be formed in the opening. A memory layer may be formed before the channel layer 53 is formed. After an insulating core 55 is formed, a conductive pad 54 may be formed, Each of the pillar structures P may include an electrode layer instead of the channel layer 53. The insulating core 55 or the conductive pad 54 may be omitted.

Figure 6A:
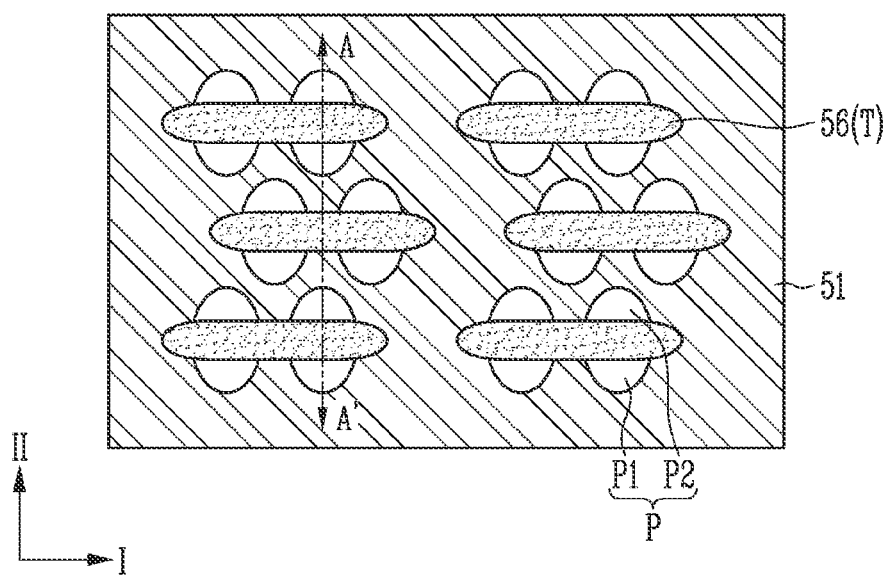
Figure 6B:
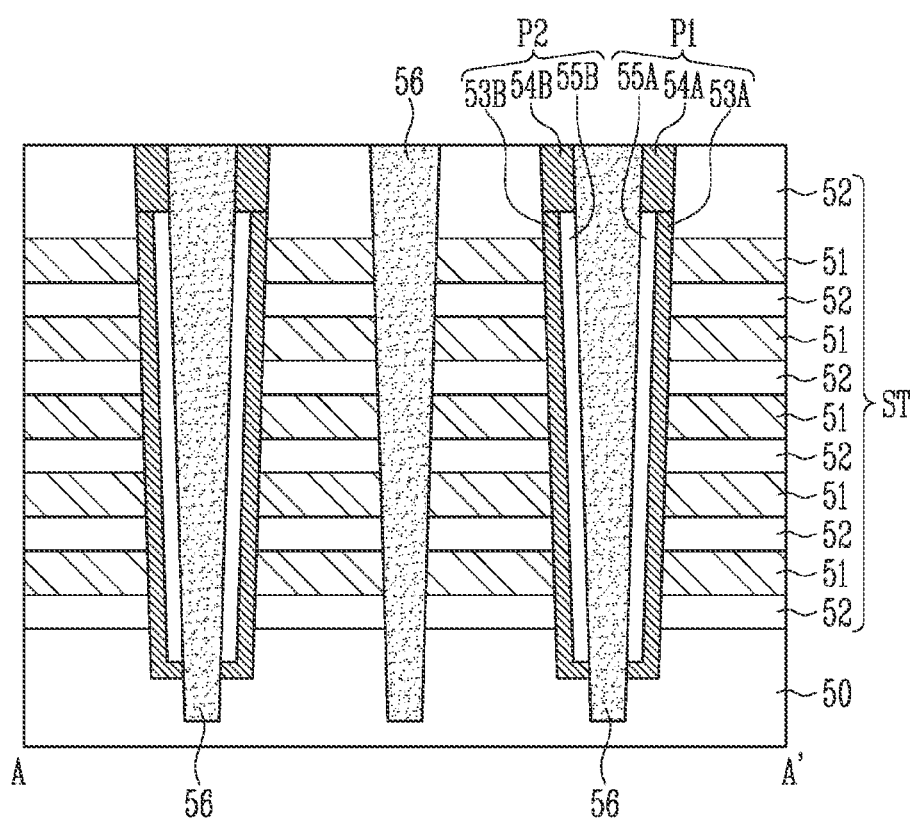

Referring to FIGS. 6A and 6B, cutting structures 56 may be formed. Each of the cutting structures 56 may pass through at least two pillar structures P and extend in the first direction I. Each of the pillar structures P may be separated into the first pillar structure P1 and the second pillar structure P2.

The first pillar structure P1 may be a first channel structure and the second pillar structure P2 may be a second channel structure. The first pillar structure P1 may include a first channel layer 53A, a first conductive pad 54A, and a first insulating core 55A. The second pillar structure P2 may include a second channel layer 53B, a second conductive pad 54B, and a second insulating core 55B. Alternatively, however, the first pillar structure P1 may be a first electrode structure and the second pillar structure P2 may be a second electrode structure. The first electrode structure may include a first electrode layer instead of the second channel layer 53A. The second electrode structure may include a second electrode layer instead of the second channel layer 53B.

According to an embodiment, trenches T that pass through the stacked structure ST and the pillar structures P may be formed. The trenches T may extend in depth to completely pass through the pillar structures P and reach the base 50. The trenches T may extend in the first direction I and pass through at least two pillar structures P. Subsequently, the cutting structures 56 may be formed in the trenches T. The cutting structures 56 may be provided to insulate the first pillar structure P1 and the second pillar structure P2 from each other, and may include an insulating material.

Figure 7A:
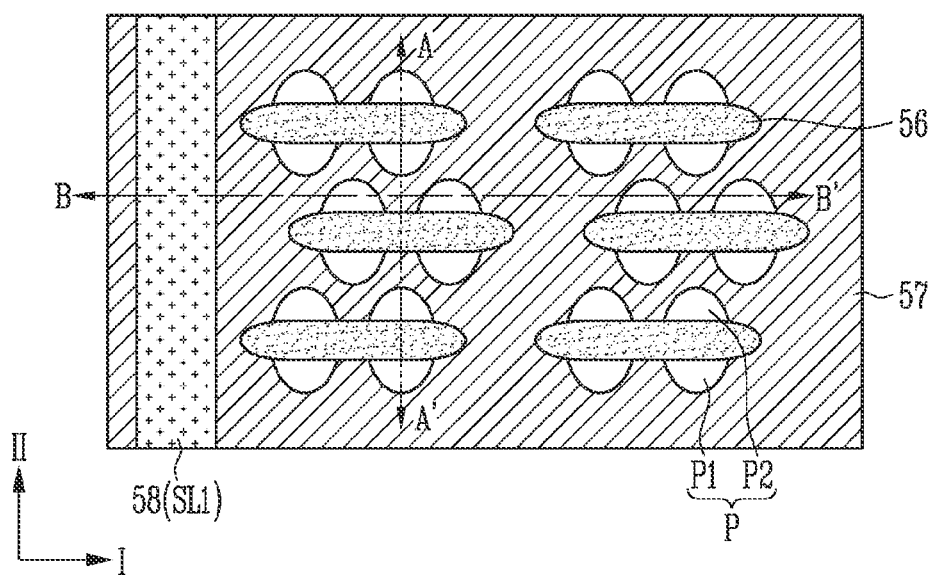
Figure 7B:
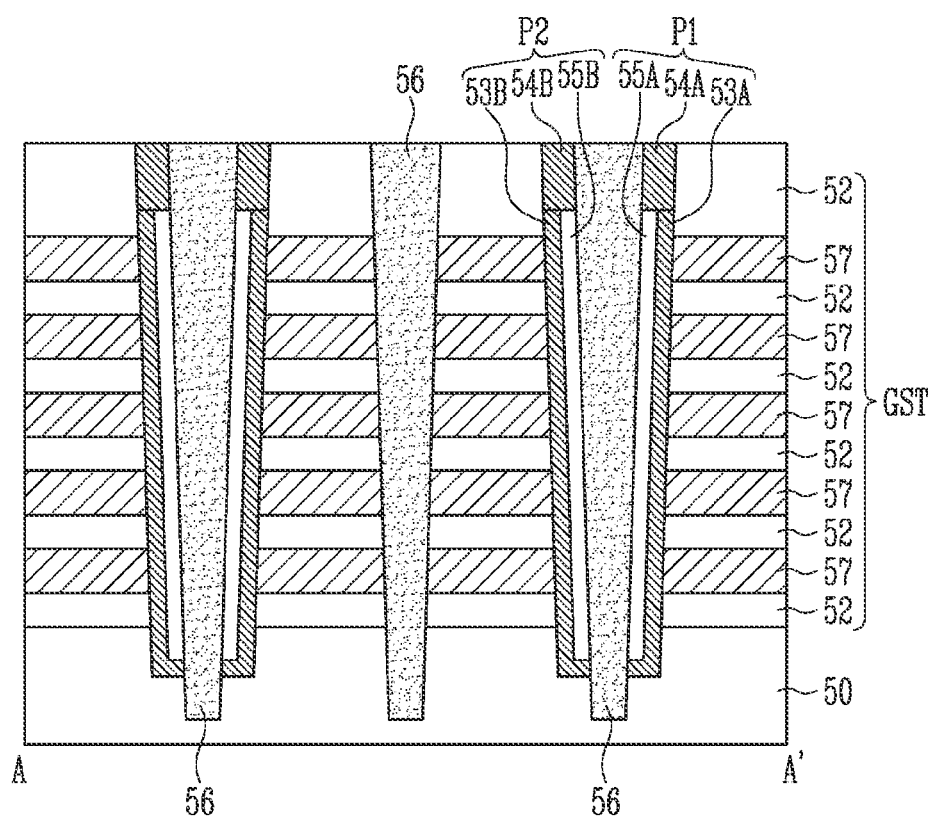
Figure 7C:
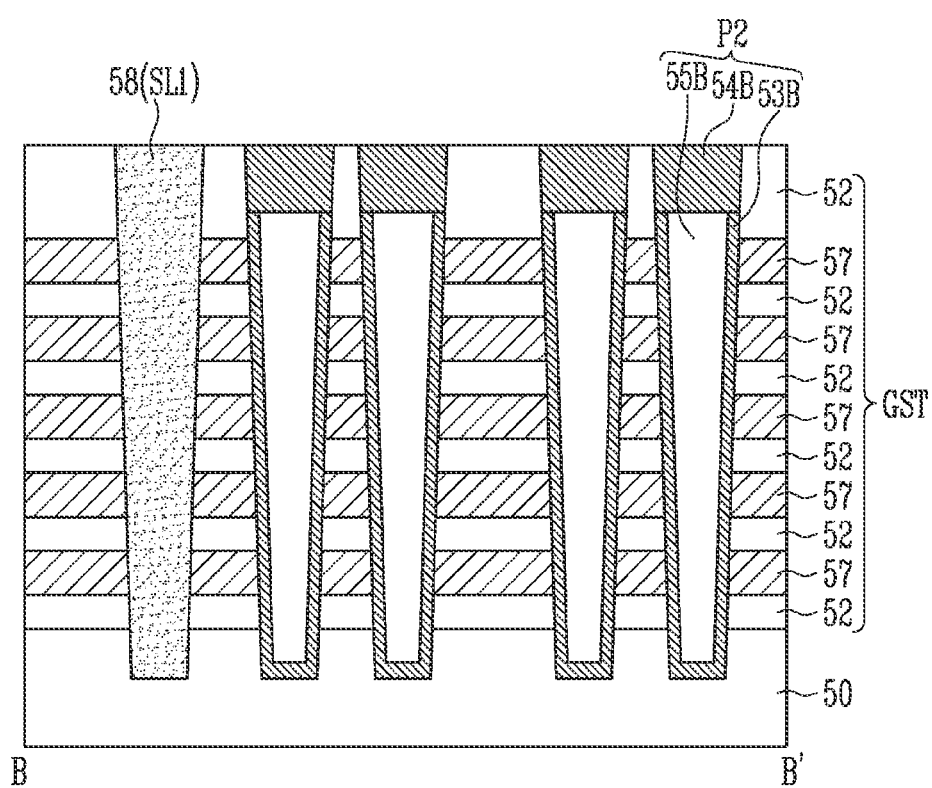

Referring to FIGS. 7A to 7C, a first slit SL1 may be formed through the stacked structure ST. The first slit SL1 may extend in a direction crossing the cutting structure 56. The first slit SL1 may extend in the second direction II and the first slit SL1 may be spaced apart from the cutting structures 56. The first slit SL1 may have a depth to expose the first material layers 51 and extend to the base 50.

Subsequently, the first material layers 51 may be replaced with third material layers 57. For example, when the first material layers 51 are sacrificial layers and the second material layers 52 are insulating layers, the first material layers 51 may be replaced by conductive layers. After the first material layers 51 are selectively etched, the third material layers 57 may be formed in areas from which the first material layers 51 are etched. However, a memory layer may be formed before the third material layers 57 are formed. In another example, when the first material layers 51 are conductive layers and the second material layers 52 are insulating layers, the first material layers 51 may be silicided. As a result, the gate structure GST in which the third material layers 57 and the second material layers 52 are stacked alternately with each other may be formed. Subsequently, a first slit structure 58 may be formed in the first slit SL1.

Figure 8A:
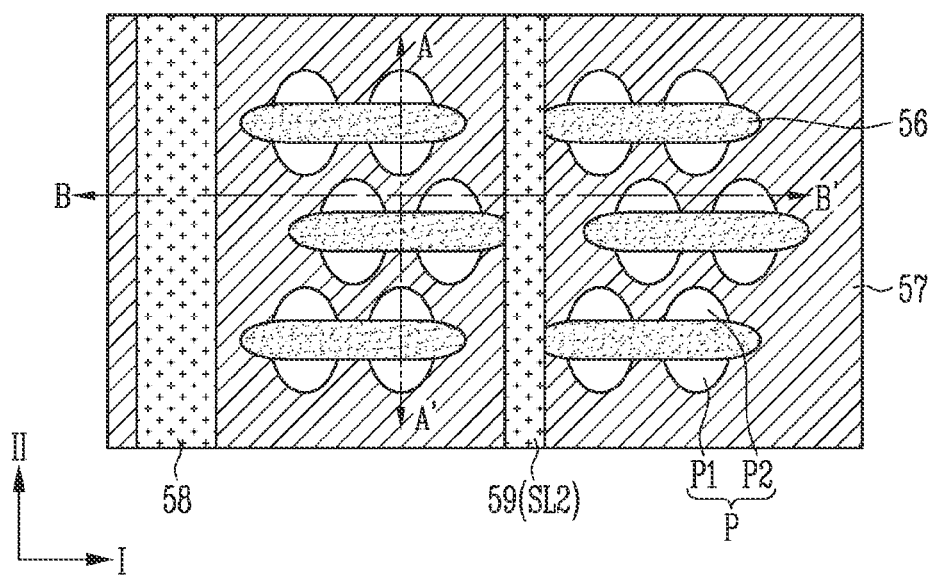
Figure 8B:
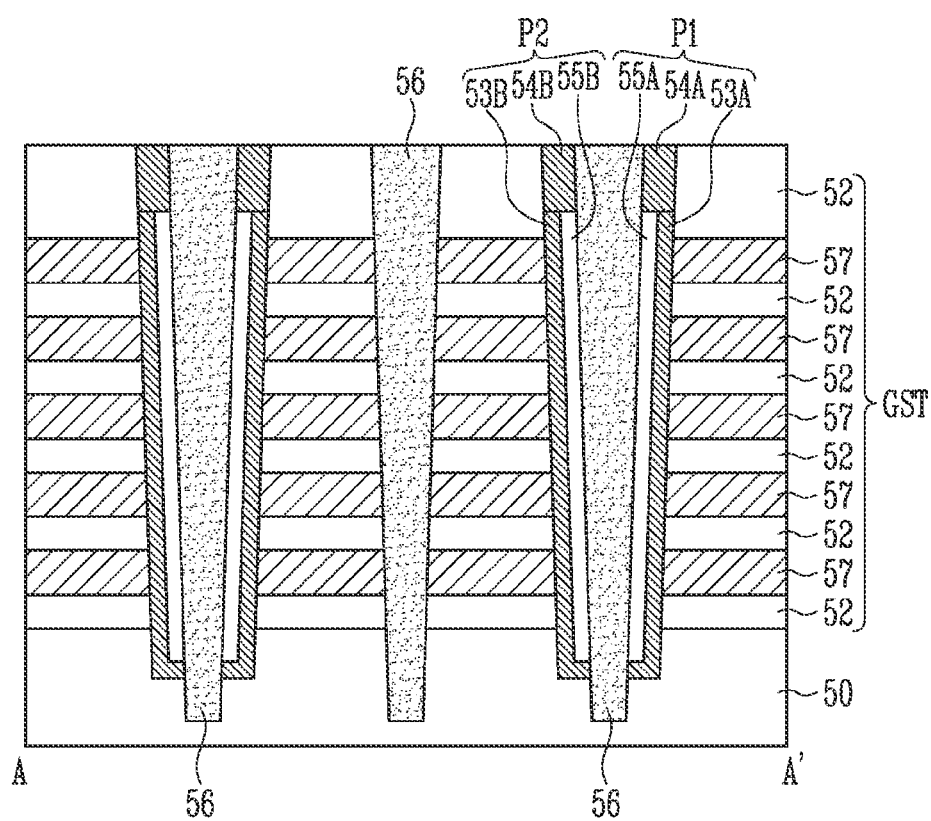
Figure 8C:
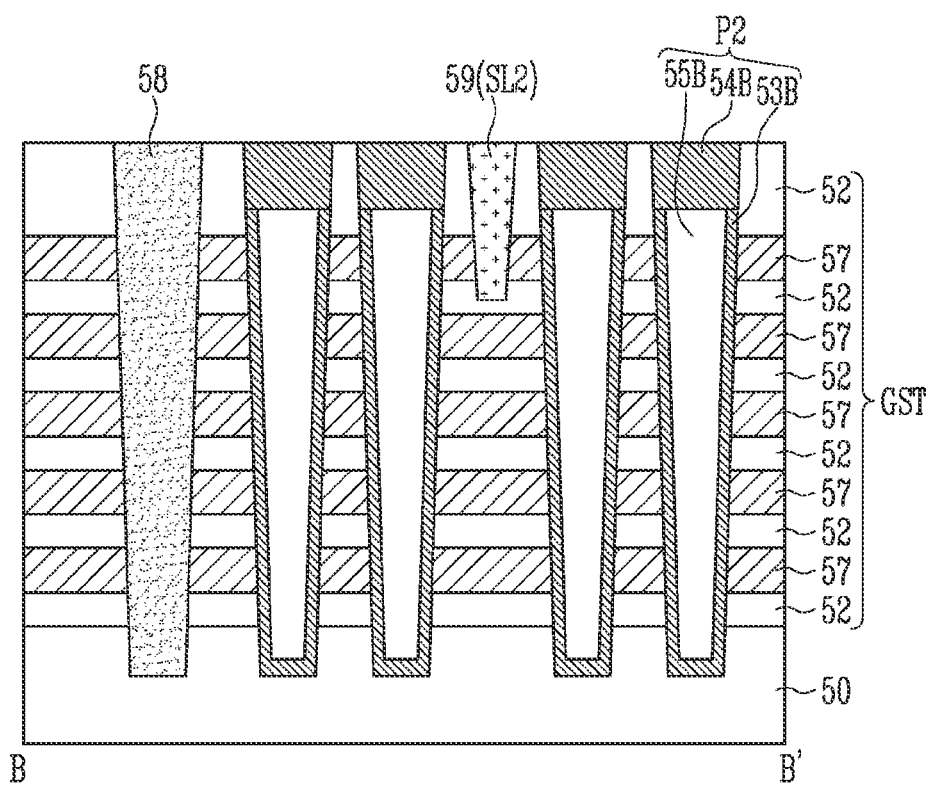

Referring to FIGS. 8A to 8C, a second slit SL2 may be formed through the gate structure GST. The second slit structure SLS2 may pass through the gate structure GST at a shallower depth than the first slit structure 58 or the cutting structure 56. The second slit SL2 may extend in a direction crossing the cutting structures 56, and may extend in the second direction II. In the plane defined by the first direction I and the second direction II, the second slit SL2 may have a linear shape, a zigzag shape, a wave shape, or the like.

The second slit SL2 may be formed between the pillar structures P. When the second slit SL2 is formed, the cutting structure 56 or the pillar structure P may be etched together with the stacked structure ST. Therefore, the cutting structure 56 or the pillar structure P may be exposed through the second slit SL2. The second slit SL2 may be formed to cross the cutting structure 56. One cutting structure 56 may be separated into a plurality of patterns by the second slit SL2.

Subsequently, a second slit structure 59 may be formed in the second slit SL2. The second slit structure 59 may include an insulating material. At least one uppermost third material layer 57 may be separated into a plurality of patterns by the second slit structure 59. The second slit structure 59 may contact a neighboring cutting structure 56 or pillar structure P.

Though not shown in the drawings, interconnection lines coupled to the pillar structures P may be formed. According to an embodiment, at least one first bit line which extends in the first direction I and is coupled to the first pillar structures P1 may be formed, and at least one second bit line which extends in the first direction I and is coupled to the second pillar structures P2 may be formed.

According to the above-described manufacturing method, one pillar structure P may be separated into the plurality of pillar structures P1 and P2 using the cutting structure 56. Therefore, the number of memory cells realized with one pillar structure P may be increased. In addition, by forming the second slit SL2 in a direction crossing the cutting structure 56, the processes of replacing the first material layers 51 with the third material layers 57 may be improved.

Figure 9A:
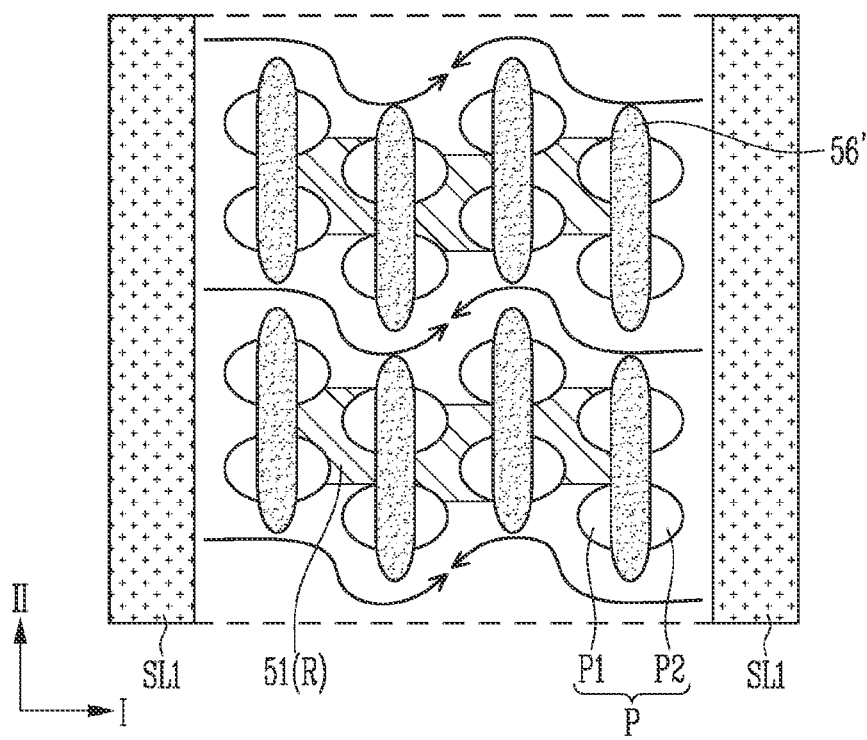
Figure 9B:
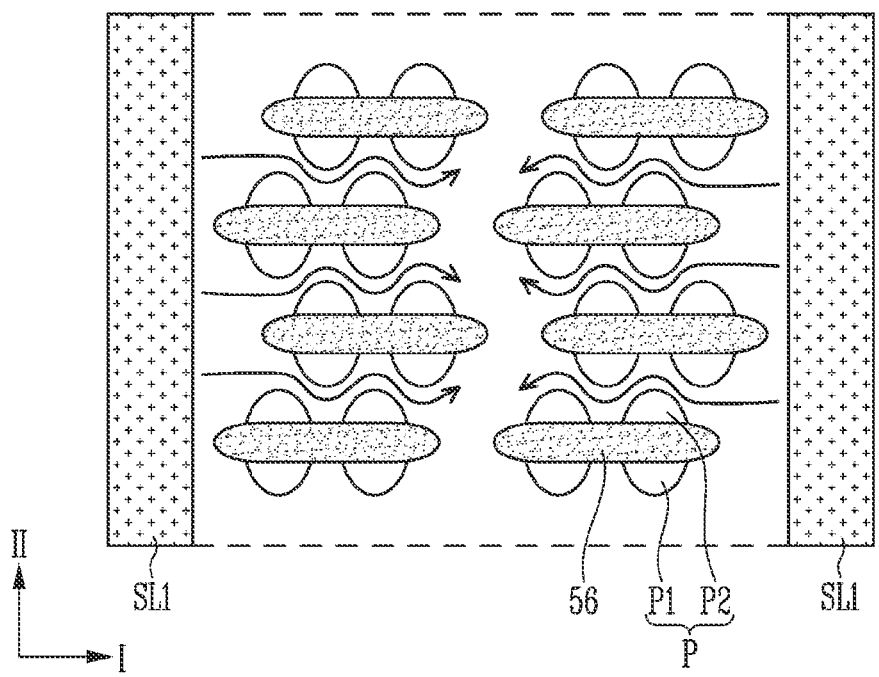

FIGS. 9A and 9B are diagrams illustrating a method of manufacturing a semiconductor device according to an embodiment of the present disclosure.

FIGS. 9A and 9B are diagrams for visualizing the influence of the arrangements of cutting structures 56 and 56' and the first slit SL1 during the processes of replacing the first material layers 51 with the third material layers 57. To replace the first material layers 51 with the third material layers 57, after the first material layers 51 are selectively etched, the third material layers 57 may be deposited onto areas from which the first material layers 51 are etched. An etch process of the first material layers 51 may be performed using a chemical such as an etchant. A chemical may be introduced between the pillar structures P and the cutting structures 56 and 56' (as indicated by arrows) to selectively etch the first material layers 51.

Referring to FIG. 9A, the first slits SL1 may be formed in parallel with the cutting structures 56'. A flow path of the chemical may be restricted by the cutting structures 56' extending in the second direction II. Therefore, the chemical may be resisted from flowing between the cutting structures 56' neighboring each other in the first direction I, and a region R of the first material layers may remain without being etched.

Referring to FIG. 9B, the first slits SL1 may be formed to cross the cutting structures 56. According to an embodiment, the first slits SL1 may be formed to be perpendicular to the cutting structures 56. Because the cutting structures 56 extend in the first direction I, the flow path of the chemical may not be restricted, or may be less restricted. Therefore, the chemical may be sufficiently introduced between the cutting structures 56 and between the pillar structures P. As a result, a region where the first material layers 51 remain without being etched may be reduced.

Figure 10:
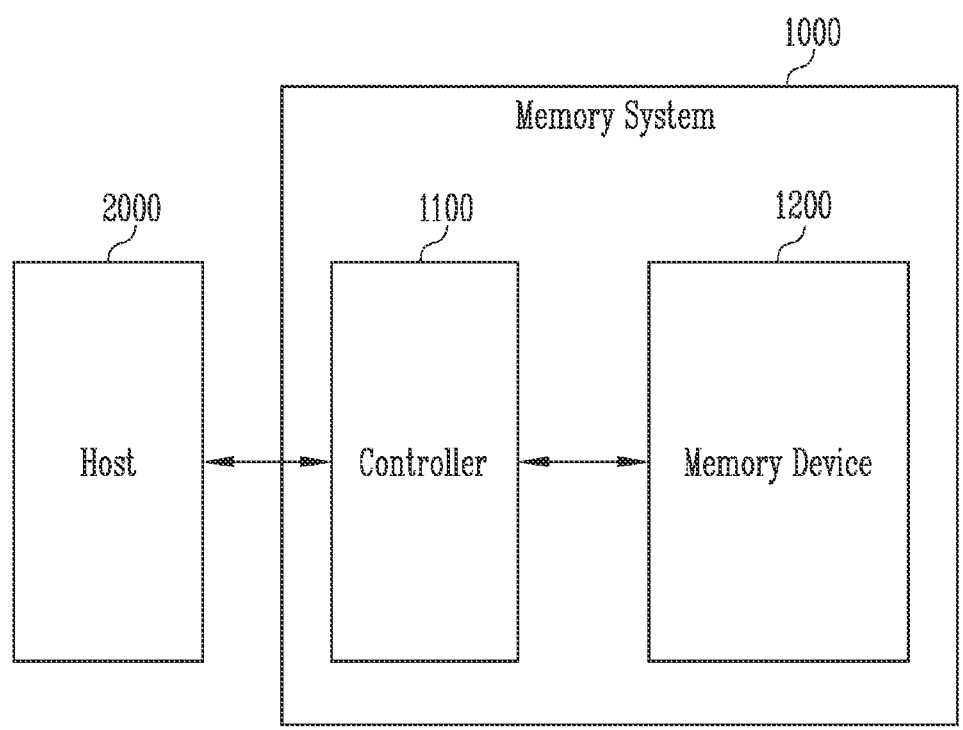
FIG. 10 is a diagram illustrating a memory system according to an embodiment of the present disclosure.

FIG. 10 is a diagram illustrating a memory system 1000 according to an embodiment of the present disclosure.

Referring to FIG. 10, the memory system 1000 may include a memory device 1200 configured to store data and a controller 1100 configured to perform communications between the memory device 1200 and a host 2000.

The host 2000 may be a device or system configured to store data in the memory system 1000 or retrieve data from the memory system 1000. The host 2000 may generate requests for various operations and output the generated requests to the memory system 1000. The requests may include a program request for a program operation, a read request for a read operation, and an erase request for an erase operation. The host 2000 may communicate with the memory system 1000 by using at least one interface protocol among, for example, Peripheral Component Interconnect Express (PCIe), Advanced Technology Attachment (ATA), Serial ATA (SATA), Parallel ATA (PATA), Serial Attached SCSI (SAS), Non-Volatile Memory express (NVMe), Universal Serial Bus (USB), Mult Media Card (MMC), Enhanced Small Disk Interface (ESDI), and Integrated Drive Electronics (IDE).

The host 2000 may include at least one of a computer, a portable digital device, a tablet, a digital camera, a digital audio player, a television, a wireless communication device, or a cellular phone. However, embodiments of the disclosed technology are not limited thereto.

The controller 1100 may control overall operations of the memory system 1000. The controller 1100 may control the memory device 1200 in response to the requests of the host 2000. The controller 1100 may control the memory device 1200 to perform a program operation, a read operation and an erase operation at the request of the host 2000. Alternatively, the controller 1100 may perform a background operation for performance improvement of the memory system 1000 in the absence of the request from the host 2000.

To control the operations of the memory device 1200, the controller 1100 may transfer a control signal and a data signal to the memory device 1200. The control signal and the data signal may be transferred to the memory device 1200 through different input/output lines. The data signal may include a command, an address, or data. The control signal may be used to differentiate periods in which the data signal is input.

The memory device 1200 may perform a program operation, a read operation, and an erase operation in response to control of the controller 1100, The memory device 1200 may include volatile memory that loses data when a power supply is blocked, or non-volatile memory that retains data in the absence of supplied power. The memory device 1200 may be a semiconductor device which has the structure as described above with reference to FIGS. 1A to 1D, FIGS. 2A to 2C, FIGS. 3A to 3C, and FIGS. 4A to 4D. The memory device 1200 may be a semiconductor device manufactured by the method as described above with reference to FIGS. 5A and 5B, FIGS. 6A and 6B, FIGS. 7A to 7C, and FIGS. 8A to 8C. According to an embodiment, a semiconductor device may include a gate structure that includes conductive layers and insulating layers stacked alternately with each other, channel structures that pass through the gate structure and are arranged in a first direction, a cutting structure that extends in the first direction and successively passes through the channel structures, and a first slit structure that passes through the gate structure and extends in a second direction crossing the first direction.

Figure 11:
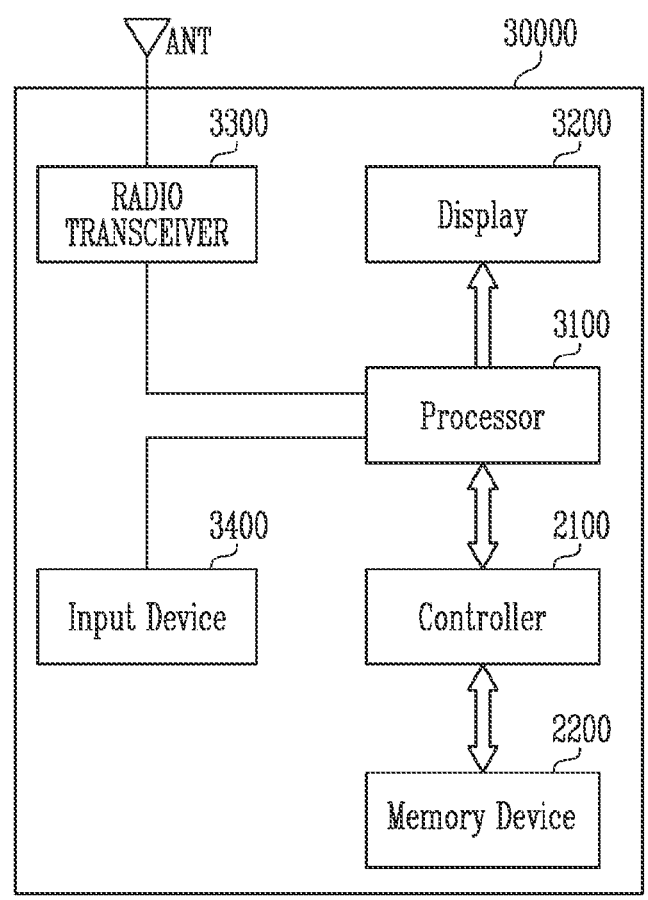
FIG. 11 is a diagram illustrating a memory system according to an embodiment of the present disclosure.

FIG. 11 is a diagram illustrating a memory system 30000 according to an embodiment of the present disclosure.

Referring to FIG. 11, the memory system 30000 may be incorporated into a cellular phone, a smart phone, a tablet, a personal computer (PC), a personal digital assistant (PDA), or a wireless communication device. The memory system 30000 may include a memory device 2200 and a controller 2100 controlling the operations of the memory device 2200.

The controller 2100 may control a data access operation of the memory device 2200, for example, a program operation, an erase operation, or a read operation of the memory device 2200 in response to control of a processor 3100.

The data programmed into the memory device 2200 may be output through a display 3200 in response to control of the controller 2100.

A radio transceiver 3300 may exchange a radio signal through an antenna ANT. For example, the radio transceiver 3300 may change the radio signal received through the antenna ANT into a signal which may be processed by the processor 3100. Therefore, the processor 3100 may process the signal output from the radio transceiver 3300 and transfer the processed signal to the controller 2100 or the display 3200. The controller 2100 may transfer the signal processed by the processor 3100 into the memory device 2200, In addition, the radio transceiver 3300 may change a signal output from the processor 3100 into a radio signal and output the radio signal to an external device through the antenna ANT. A control signal for controlling the operations of the host or data to be processed by the processor 3100 may be input by an input device 3400, and the input device 3400 may include a pointing device, such as a touch pad and a computer mouse, a keypad, or a keyboard. The processor 3100 may control the operations of the display 3200 so that data output from the controller 2100, data output from the radio transceiver 3300, or data output from an input device 3400 may be output through the display 3200.

According to an embodiment, the controller 2100 capable of controlling the operations of the memory device 2200 may be realized as a portion of the processor 3100, or as a separate chip from the processor 3100.

Figure 12:
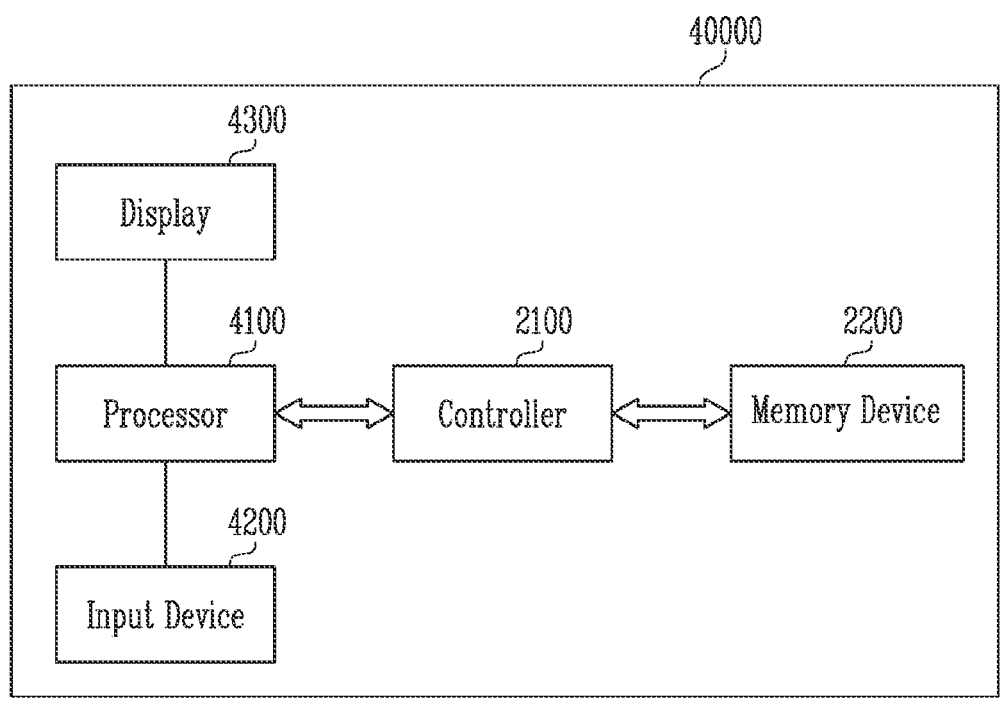
FIG. 12 is a diagram illustrating a memory system according to an embodiment of the present disclosure.

FIG. 12 is a diagram illustrating a memory system 40000 according to an embodiment of the present disclosure.

Referring to FIG. 12, the memory system 40000 may be incorporated into a personal computer (PC), a tablet PC, a net-book, an e-reader, a personal digital assistant (PDA), a portable multimedia player (PMP), an MP3 player, or an MP4 player.

The memory system 40000 may include the memory device 2200 and the controller 2100 that controls a data processing operation of the memory device 2200.

A processor 4100 may output data stored in the memory device 2200 through a display 4300 according to data input through an input device 4200. Examples of the input device 4200 may include a pointing device such as a touch pad or a computer mouse, a keypad, or a keyboard.

The processor 4100 may control overall operations of the memory system 40000 and control operations of the controller 2100. According to an embodiment, the controller 2100 capable of controlling the operations of the memory device 2200 may be realized as a portion of the processor 4100, or as a separate chip from the processor 4100.

Figure 13:
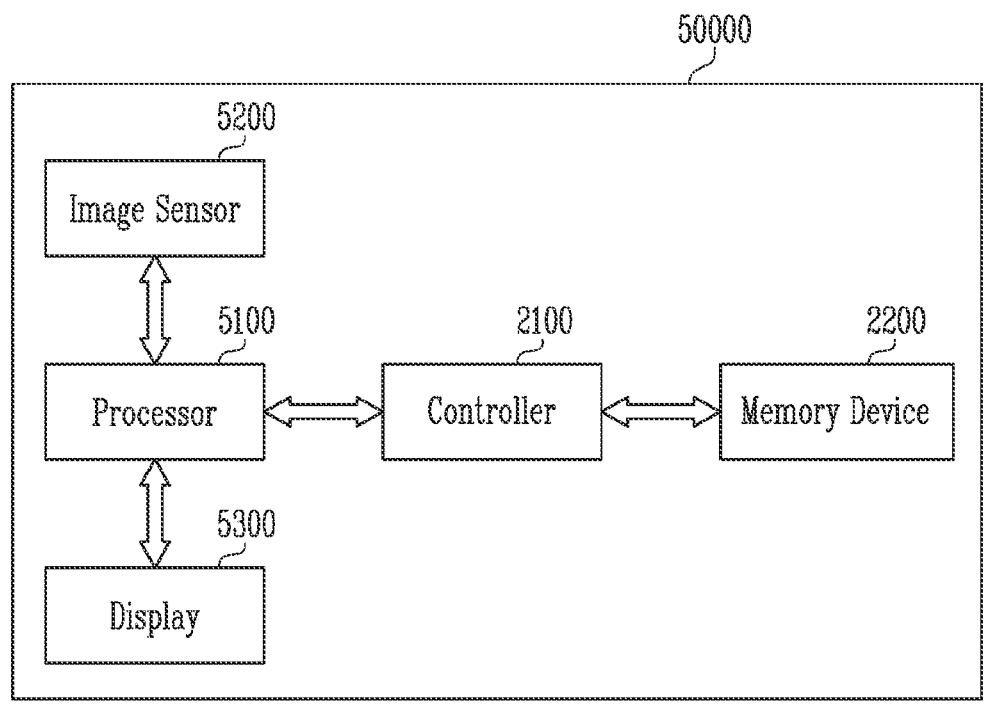
FIG. 13 is a diagram illustrating a memory system according to an embodiment of the present disclosure.

FIG. 13 is a block diagram illustrating a memory system 50000 according to an embodiment of the present disclosure.

Referring to FIG. 13, the memory system 50000 may be incorporated into an image processor, for example, a digital camera, a cellular phone with a digital camera attached thereto, a smart phone with a digital camera attached thereto, or a table PC with a digital camera attached thereto.

The memory system 50000 may include the memory device 2200 and the controller 2100 that controls a data processing operation of the memory device 2200, for example, a program operation, an erase operation, or a read operation.

An image sensor 5200 of the memory system 50000 may convert an optical image into digital signals. The converted digital signals may be transferred to a processor 5100 or the controller 2100. In response to control of the processor 5100, the converted digital signals may be output through a display 5300 or stored in the memory device 2200 through the controller 2100. In addition, the data stored in the memory device 2200 may be output through the display 5300 in response to control of the processor 5100 or the controller 2100.

According to an embodiment, the controller 2100 capable of controlling the operations of the memory device 2200 may be formed as a part of the processor 5100, or a separate chip from the processor 5100.

Figure 14:
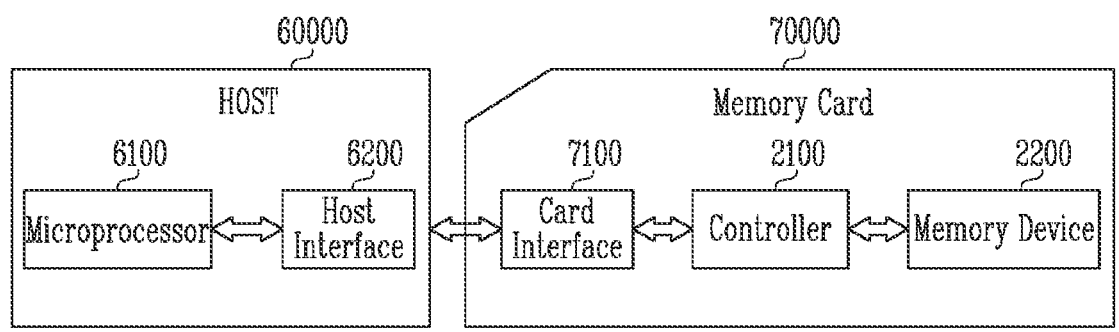
FIG. 14 is a diagram illustrating a memory system according to an embodiment of the present disclosure.

FIG. 14 is a diagram illustrating a memory system 70000 according to an embodiment of the present disclosure.

Referring to FIG. 14, the memory system 70000 may include a memory card or a smart card. The memory system 70000 may include the memory device 2200, the controller 2100, and a card interface 7100.

The controller 2100 may control the data exchange between the memory device 2200 and the card interface 7100. According to an embodiment, the card interface 7100 may be, but is not limited to, a secure digital (SD) card interface or a multi-media card (MMC) interface.

The card interface 7100 may interface the data exchange between a host 60000 and the controller 2100 according to a protocol of the host 60000, According to an embodiment, the card interface 7100 may support a Universal Serial Bus (USB) protocol and an InterChip (IC)-USB protocol.

The card interface 7100 may refer to hardware capable of supporting a protocol which is used by the host 60000, software installed in the hardware, or a signal transmission method.

When the memory system 70000 is connected to a host interface 6200 of the host 60000 such as a PC, a tablet PC, a digital camera, a digital audio player, a cellular phone, a console video game hardware, or a digital set-top box, the host interface 6200 may perform data communication with the memory device 2200 through the card interface 7100 and the controller 2100 in response to control of a microprocessor 6100.

By three-dimensionally stacking memory cells, the density of integration of a semiconductor device may be improved. In addition, a semiconductor device having a stabilized structure and improved reliability may be provided.

What is claimed is:

1. A semiconductor device, comprising:
   a gate structure including conductive layers and insulating layers alternately stacked with each other;
   channel structures passing through the gate structure in a vertical direction and arranged in a first direction, wherein the vertical direction is orthogonal to the first direction;
   a cutting structure passing through the channel structures in the first direction and passing through the channel structures in the vertical direction; and
   a first slit structure passing through the gate structure in the vertical direction and extending in a second direction, the second direction being orthogonal to the first direction and the vertical direction,
   wherein the first slit structure and the channel structures are physically spaced apart from each other.

2. The semiconductor device of claim 1, wherein each of the channel structures is separated into a first channel structure and a second channel structure by the cutting structure.

3. The semiconductor device of claim 2, further comprising:
   at least one first bit line extending in the first direction and coupled to first channel structures; and
   at least one second bit line extending in the first direction and coupled to second channel structures.

4. The semiconductor device of claim 1, further comprising a second slit structure penetrating into the gate structure at a shallower depth than both the first slit structure and the cutting structure, the second slit structure extending in the second direction.

5. The semiconductor device of claim 4, wherein the cutting structure and the second slit structure contact each other.

6. The semiconductor device of claim 1, wherein the cutting structure includes an insulating material.

7. A semiconductor device, comprising:
   a gate structure including conductive layers and insulating layers alternately stacked with each other;
   pillar structures passing through the gate structure in a vertical direction and arranged in a first direction, wherein the vertical direction is orthogonal to the first direction;
   a cutting structure passing through the pillar structures in the first direction, passing through the pillar structures in the vertical direction, and separating each of the pillar structures into a first pillar structure and a second pillar structure;
   a first slit structure passing through the gate structure in the vertical direction and extending in a second direction, wherein the second direction is orthogonal to the first direction and the vertical direction;
   a first interconnection line extending in the first direction, the first interconnection line coupled to the first pillar structures; and
   a second interconnection line extending in the first direction, the second interconnection line coupled to the second pillar structures,
   wherein the first slit structure and the pillar structures are physically spaced apart from each other.

8. The semiconductor device of claim 7, further comprising:
   first contact plugs coupled to the first pillar structures, respectively, the first contact plugs coupling the first pillar structures to the first interconnection line; and
   second contact plugs coupled to the second pillar structures, respectively, the second contact plugs coupling the second pillar structures to the second interconnection line.

9. A method of manufacturing a semiconductor device, the method comprising:
   forming a stacked structure;
   forming channel structures passing through the stacked structure in a vertical direction and arranged in a first direction, wherein the vertical direction is orthogonal to the first direction;
   forming a cutting structure passing through the channel structures in the first direction and passing through the channel structures in the vertical direction; and
   forming a first slit structure passing through the stacked structure in the vertical direction and extending in a second direction, the second direction being orthogonal to the first direction and the vertical direction,
   wherein the first slit structure and the channel structures are physically spaced apart from each other.

10. The method of claim 9, wherein forming the cutting structure comprises etching the channel structures so that each of the channel structures is separated into a first channel structure and a second channel structure.

11. The method of claim 10, further comprising:
    forming at least one first bit line extending in the first direction and coupled to first channel structures; and
    forming at least one second bit line extending in the first direction and coupled to second channel structures.

12. The method of claim 9, wherein forming the cutting structure comprises:
    forming a trench crossing at least two channel structures; and
    forming the cutting structure to include an insulating material in the trench.

13. The method of claim 9, wherein forming of the first slit structure comprises:
    forming a first slit passing through the stacked structure including alternately stacked first material layers and second material layers, the first slit extending in the second direction;

replacing the first material layers with third material layers through the first slit; and forming the first slit structure in the first slit.

14. The method of claim 9, further comprising forming a second slit structure penetrating into the stacked structure at a shallower depth than the first slit structure and extending in the second direction.

15. The method of claim 14, wherein forming the second slit structure comprises:

forming a second slit by etching the stacked structure and the cutting structure; and forming the second slit structure in the second slit.

* * * * *